(12) United States Patent
Walter

(10) Patent No.: US 9,159,873 B2
(45) Date of Patent: Oct. 13, 2015

(54) HIGH SPEED OPTICAL TILTED CHARGE DEVICES AND METHODS

(71) Applicant: Quantum Electro Opto Systems Sdn. Bhd., Melaka (MY)

(72) Inventor: Gabriel Walter, Madison, WI (US)

(73) Assignee: Quantum Electro Opto Systems Sdn. Bhd., Melaka (MY)

( * ) Notice: Subject to any disclaimer, the term of this patent is extended or adjusted under 35 U.S.C. 154(b) by 28 days.

(21) Appl. No.: 13/675,207

(22) Filed: Nov. 13, 2012

(65) Prior Publication Data
US 2013/0126825 A1   May 23, 2013

Related U.S. Application Data

(60) Provisional application No. 61/629,175, filed on Nov. 14, 2011.

(51) Int. Cl.
*H01L 33/06* (2010.01)
*H01L 33/38* (2010.01)
*H01L 33/00* (2010.01)

(52) U.S. Cl.
CPC .............. *H01L 33/06* (2013.01); *H01L 33/38* (2013.01); *H01L 33/0041* (2013.01)

(58) Field of Classification Search
CPC ........................................................ H01L 33/06
USPC .................................. 257/13, 183; 438/22, 39
See application file for complete search history.

(56) References Cited

U.S. PATENT DOCUMENTS

| | | | |
|---|---|---|---|
| 4,176,367 A | 11/1979 | Uematsu | 357/19 |
| 4,580,293 A | 4/1986 | Reichle | 455/609 |
| 4,710,936 A | 12/1987 | Shibata et al. | 372/45 |
| 4,845,541 A | 7/1989 | Xu et al. | 357/34 |
| 5,796,714 A | 8/1998 | Chino et al. | 372/50 |
| 6,479,844 B2 | 11/2002 | Taylor | 257/192 |
| 6,727,530 B1 | 4/2004 | Shen et al. | 257/184 |

(Continued)

FOREIGN PATENT DOCUMENTS

| | | |
|---|---|---|
| JP | 61270885 | 12/1986 |
| WO | WO2004/047181 | 6/2004 |
| WO | WO2007/121524 | 11/2007 |

OTHER PUBLICATIONS

Ledistor—A Three Terminal Double Heterostructure Optoelectronic Switch, G.W. Taylor et al., Appl. Phys. Lett. 50, 6 (1987).

(Continued)

*Primary Examiner* — Tran Tran
(74) *Attorney, Agent, or Firm* — Martin Novack

(57) ABSTRACT

A method for producing optical signals with improved efficiency, including the following steps: providing a layered semiconductor structure that includes a substrate, a semiconductor collector region of a first conductivity type, a semiconductor base region of a second conductivity type disposed on the collector region, and a semiconductor emitter region of the first semiconductor type disposed as a mesa over a portion of a surface of the base region; providing, in the base region, at least one region exhibiting quantum size effects; providing collector, base, and emitter electrodes, respectively coupled with the collector, base and emitter regions; providing a tunnel barrier layer over at least the exposed portion of the surface of the base region; and applying signals with respect to the collector, base, and emitter electrodes to produce optical signals from the base region.

22 Claims, 8 Drawing Sheets

(56) References Cited

U.S. PATENT DOCUMENTS

| | | | |
|---|---|---|---|
| 6,728,494 B2 | 4/2004 | Numata et al. | 398/182 |
| 6,974,969 B2 | 12/2005 | Taylor | 257/24 |
| 7,043,161 B2 | 5/2006 | Jung | 398/139 |
| 7,091,082 B2 | 8/2006 | Feng | 438/235 |
| 7,247,892 B2 | 7/2007 | Taylor | 257/197 |
| 7,280,769 B2 | 10/2007 | Astrauskas | 398/202 |
| 7,286,583 B2 | 10/2007 | Feng et al. | 372/30 |
| 7,354,780 B2 | 4/2008 | Feng et al. | 257/292 |
| 7,535,034 B2 | 5/2009 | Walter et al. | 372/43 |
| 7,711,015 B2 | 5/2010 | Holonyak et al. | 372/11 |
| 7,813,396 B2 | 10/2010 | Feng et al. | 372/43.01 |
| 7,998,807 B2 | 8/2011 | Feng et al. | 438/235 |
| 2001/0050934 A1 | 12/2001 | Choquette et al. | 372/43 |
| 2003/0211647 A1 | 11/2003 | Bour et al. | 438/48 |
| 2003/0213973 A1* | 11/2003 | Yoshioka et al. | 257/183 |
| 2004/0091270 A1 | 5/2004 | Choi et al. | 398/130 |
| 2005/0007323 A1 | 1/2005 | Appelbaum et al. | 345/87 |
| 2005/0040387 A1 | 2/2005 | Feng et al. | 257/14 |
| 2005/0040432 A1 | 2/2005 | Feng et al. | 257/198 |
| 2005/0054172 A1 | 3/2005 | Feng et al. | 438/313 |
| 2006/0093010 A1 | 5/2006 | Sekiya et al. | 372/99 |
| 2007/0065160 A1 | 3/2007 | Shinohara | 398/182 |
| 2008/0089368 A1 | 4/2008 | Feng et al. | 372/25 |
| 2008/0205461 A1 | 8/2008 | Henrichs | 372/29.023 |
| 2008/0240173 A1 | 10/2008 | Holonyak et al. | 372/9 |
| 2009/0134939 A1 | 5/2009 | Feng et al. | 327/581 |
| 2010/0034228 A1 | 2/2010 | Holonyak et al. | 374/45 |
| 2010/0073086 A1 | 3/2010 | Holonyak, Jr. et al. | 330/149 |
| 2010/0103971 A1 | 4/2010 | Then et al. | 372/45.01 |
| 2010/0202483 A1 | 8/2010 | Walter et al. | 372/45.01 |
| 2010/0202484 A1 | 8/2010 | Holonyak, Jr. et al. | 372/45.01 |
| 2010/0272140 A1 | 10/2010 | Walter et al. | 372/38.02 |
| 2010/0289427 A1* | 11/2010 | Walter et al. | 315/291 |
| 2010/0315018 A1 | 12/2010 | Then et al. | 315/291 |
| 2011/0042647 A1* | 2/2011 | Choi | 257/21 |
| 2011/0150487 A1 | 6/2011 | Walter | 398/115 |
| 2012/0068151 A1* | 3/2012 | Walter | 257/9 |

OTHER PUBLICATIONS

Light-Emitting Transistor: Light Emission From InGaP/GaAs Heterojunction Bipolar Transistors, M. Feng, N. Holonyak, Jr., and W. Hafez, Appl. Phys. Lett. 84, 151 (2004).

Quantum-Well-Base Heterojunction Bipolar Light-Emitting Transistor, M. Feng, N. Holonyak, Jr., and R. Chan, Appl. Phys. Lett. 84, 1952 (2004).

Type-II GaAsSb/InP Heterojunction Bipolar Light-Emitting Transistor, M. Feng, N. Holonyak, Jr., B. Chu-Kung, G. Walter, and R. Chan, Appl. Phys. Lett. 84, 4792 (2004).

Laser Operation of a Heterojunction Bipolar Light-Emitting Transistor, G. Walter, N. Holonyak, Jr., M. Feng, and R. Chan, Appl. Phys. Lett. 85, 4768 (2004).

Microwave Operation and Modulation of a Transistor Laser, R. Chan, M. Feng, N. Holonyak, Jr., and G. Walter, Appl. Phys. Lett. 86, 131114 (2005).

Room Temperature Continuous Wave Operation of a Heterojunction Bipolar Transistor Laser, M. Feng, N. Holonyak, Jr., G. Walter, and R. Chan, Appl. Phys. Lett. 87, 131103 (2005).

Visible Spectrum Light-Emitting Transistors, F. Dixon, R. Chan, G. Walter, N. Holonyak, Jr., M. Feng, X. B. Zhang, J. H. Ryou, and R. D. Dupuis, Appl. Phys. Lett. 88, 012108 (2006).

The Transistor Laser, N. Holonyak, M Feng, Spectrum, IEEE vol. 43, Issue 2, Feb. 2006.

Signal Mixing in a Multiple Input Transistor Laser Near Threshold, M. Feng, N. Holonyak, Jr., R. Chan, A. James, and G. Walter, Appl. Phys. Lett. 88, 063509 (2006).

Collector Current Map of Gain and Stimulated Recombination on the Base Quantum Well Transitions of a Transistor Laser, R. Chan , N. Holonyak, Jr. , A. James , G. Walter, Appl. Phys. Lett. 88, 143508 (2006).

Collector Breakdown in the Heterojunction Bipolar Transistor laser, G. Walter, A. James, N. Holonyak, Jr., M. Feng, and R. Chan, Appl. Physics Lett. 88, 232105 (2006).

High-Speed (≥1 GHz) Electrical and Optical Adding, Mixing, and Processing of Square-Wave Signals With a Transistor Laser, M. Feng, N. Holonyak, Jr., R. Chan, A. James, and G. Walter, IEEE Photonics Technology Lett., vol. 18, No. 11, Jun. 1, 2006.

Graded-Base InGaN/GaN Heterojunction Bipolar Light-Emitting Transistors, B.F. Chu-Kung, M. Feng, G. Walter, and J. Holonyak, Jr. et al., Appl. Physics Lett. 89, 082108 (2006).

Carrier Lifetime and Modulation Bandwidth of a Quantum Well AlGaAs/InGaP/GaAs/InGaAs Transistor Laser, M. Feng, N. Holonyak, Jr., A. James, K. Cimino, G. Walter, and R. Chan, Appl. Phys. Lett 89, 113504 (2006).

Chirp in a Transistor Laser: Franz-Keldysh Reduction of the Linewidth Enhancement, G. Walter, A. James, N. Holonyak, Jr., and M. Feng, App. Phys. Lett. 90, 091109 (2007).

Photon-Assisted Breakdown, Negative Resistance, and Switching in a Quantum-Well Transistor Laser, A. James, G. Walter, M. Feng, and N. Holonyak, Jr., Appl. Phys. Lett. 90, 152109 (2007).

Franz-Keldysh Photon-Assisted Voltage-Operated Switching of a Transistor Laser, A. James, N. Holonyak, M. Feng, and G. Walter, Photonics Technology Letters, IEEE vol. 19 Issue: 9 (2007).

Experimental Determination of the Effective Minority Carrier Lifetime in the Operation of a Quantum-Well n-p-n Heterojunction Bipolar Light-Emitting Transistor of Varying Base Quantum-Well Design and Doping; H.W. Then, M. Feng, N. Holonyak, Jr., and C. H. Wu, Appl. Phys. Lett. 91, 033505 (2007).

Charge Control Analysis of Transistor Laser Operation, M. Feng, N. Holonyak, Jr., H. W. Then, and G. Walter, Appl. Phys. Lett. 91, 053501 (2007).

Optical Bandwidth Enhancement by Operation and Modulation of the First Excited State of a Transistor Laser, H. W. Then, M. Feng, and N. Holonyak, Jr., Appl. Phys. Lett. 91, 183505 (2007).

Modulation of High Current Gain (β>49) Light-Emitting InGaN/GaN Heterojunction Bipolar Transistors, B. F. Chu-Kung, C. H. Wu, G. Walter, M. Feng, N. Holonyak, Jr., T. Chung, J.-H. Ryou, and R. D. Dupuis, Appl. Phys. Lett. 91, 232114 (2007).

Collector Characteristics and the Differential Optical Gain of a Quantum-Well Transistor Laser, H. W. Then, G. Walter, M. Feng, and N. Holonyak, Jr., Appl. Phys. Lett. 91, 243508 (2007).

InAlGaAs/InP Light-Emitting Transistors Operating Near 1.55 μm, Yound Huang, Xue-Bing Zhang, Jae-Hyun Ryun, Russell D. Dupuis, Forest Dixon, Nick Holonyak, Jr., and Milton Feng., J. Appl. Phys. 103 114505 (2008).

Transistor Laser With Emission Wavelength at 1544 nm, F. Dixon, M. Feng, N. Holonyak, Jr., Yong Huang, X. B. Zhang, J. H. Ryou, and R. D. Dupuis, Appl. Phys. Lett. 93, 021111 (2008).

Optical Bandwidth Enhancement of Heterojunction Bipolar Transistor Laser Operation With an Auxiliary Base Signal, H.W. Then, G. Walter, M. Feng, and N. Holonyak, Jr., Appl. Phys. Lett. 93, 163504 (2008).

Bandwidth Extension by Trade-Off of Electrical and Optical Gain in a Transistor Laser: Three-Terminal Control, H. W. Then, M. Feng, and N. Holonyak, Jr., Appl. Phys. Lett. 94, 013509 (2009).

Tunnel Junction Transistor Laser, M. Feng, N. Holonyak, Jr., H. W. Then, C. H. Wu, and G. Walter, Appl. Phys. Lett. 94, 041118 (2009).

Electrical-Optical Signal Mixing and Multiplication (2 → 22 GHz) With a Tunnel Junction Transistor Laser, H.W. Then, C.H. Wu, G. Walter, M. Feng and N. Holonyak, Jr., Appl. Phys. Lett. 94, 10114 (2009).

Scaling of Light Emitting Transistor for Multigigahertz Optical Bandwidth, C.H. Wu, G. Walter, H.W. Then, M. Feng and N. Holonyak, Jr., Appl. Phys. Lett. 94, 171101 (2009).

Device Performance of Light Emitting Transistors With C-Doped and Zn-Doped Base Layers, Y. Huang, J.-H. Ryou, R.D. Dupuis, F. Dixon, N. Holonyak, Jr., and M. Feng, IPRM '09 IEEE Intl. Conf. May 10-14, 2009.

Tilted-Charge High Speed (7 GHz) Light Emitting Diode, G. Walter, C. H. Wu, H. W. Then, M. Feng, and N. Holonyak, Jr., Appl. Phys. Lett. 94, 231125 (2009).

4.3 GHz Optical Bandwidth Light Emitting Transistor, G. Walter, C. H. Wu, H. W. Then, M. Feng, and N. Holonyak, Jr., Appl. Phys. Lett. 94, 241101 (2009).

(56) References Cited

OTHER PUBLICATIONS

Resonance-Free Frequency Response of a Semiconductor Laser, M. Feng, H. W. Then, N. Holonyak, Jr., G. Walter, and A. James, Appl. Phys. Lett. 95, 033509 (2009).

4-GHz Modulation Bandwidth of Integrated 2X2 LED Array, Chao-Hsin Wu; Walter, G.; Han Wui Then; Feng, M.; Holonyak, N.; Photonics Technology Letters, IEEE vol. 21, Issue: 24 (2009).

Physics of Base Charge Dynamics in the Three Port Transistor Laser, H. W. Then, M. Feng, and N. Holonyak, Appl. Phys. Lett. 96, 113509 (2010).

Microwave Circuit Model of the Three-Port Transistor Laser, H. W. Then, M. Feng, and N. Holonyak, J. Appl. Phys. 107, 094509 (2010).

Distributed Feedback Transistor Laser, F. Dixon, M. Feng, and N. Holonyak, Appl. Phys. Lett. 96, 241103 (2010).

Stochastic Base Doping and Quantum-Well Enhancement of Recombination in An n-p-n Light-Emitting Transistor or Transistor Laser, H. W. Then, C. H. Wu, M. Feng, N. Holonyak, and G. Walter, Appl. Phys. Lett. 96, 263505 (2010).

Design and Operation of Distributed Feedback Transistor Lasers, F. Dixon, M. Feng, and N. Holonyak, Jr. , Journal of Appl. Physics 108, 093109 (2010).

Temperature Dependence of a High-Performance Narrow-Stripe (1 µm) Single Quantum-Well Transistor Laser, M. Feng, N. Holonyak, Jr. and A. James, Appl. Physics Letters 98, 051107 (2011).

InP/InAlGaAs Light-Emitting Transistors and Transistor Lasers With a Carbon-Doped Base Layer, Yong Huang, Jae-Hyun Ryou, Russell Dupuis, Forest Dixon, Milton Feng, and Nick Holonyak, Jr., Journal of Appl. Physics 109, 063106 (2011).

Bandfilling and Photon-Assisted Tunneling in a Quantum-Well Transistor Laser, M. Feng, R. Bambery, and N. Holonyak, Jr., Appl. Physics Letters 98, 123505 (2011).

\* cited by examiner

| Layer | Comment | Character | Material | x | Thickness (Å) | Type | Dopant | Level (/cm³) |
|---|---|---|---|---|---|---|---|---|
| 16 | Sub-Emitter | | In(x)Ga(1-x)As | 0.500 | 50 | N | Si | 1.0E+19 |
| 15 | Sub-Emitter | | In(x)Ga(1-x)As | 0.000 | 2730 | N | Si | 5.0E+18 |
| 14 | Emitter | | In(x)Ga(1-x)P | 0.490 | 230 | N- | Si | 2.0E+17 |
| 13 | Sub-Emitter | | In(x)Ga(1-x)P | 0.490 | 300 | N- | Si | 2.0E+17 |
| 12 | Base 1 | ELDL | Al(x)Ga(1-x)As | 0.050 | 110 | P | C | 5.0E+19 |
| 11 | Base 1 | ELDL | Al(x)Ga(1-x)As | 0.005 to 0.05 | 100 | P | C | 1.0E+19 |
| 10 | Base 1, Buffer | | GaAs | 0.000 | 30 | i | UID | 1.0E+16 |
| 9 | | 980 nm | In(x)Ga(1-x)As | 0.200 | 120 | i | UID | 1.0E+16 |
| 8 | | | GaAs | | 30 | i | UID | 1.0E+16 |
| 7 | | 980 nm | In(x)Ga(1-x)As | 0.200 | 120 | i | UID | 1.0E+16 |
| 6 | Base 2, Buffer | | GaAs | 0.000 | 30 | i | UID | 1.0E+16 |
| 5 | Base 2 | ELDL | Al(x)Ga(1-x)As | 0.000 | 100 | P | C | 1.0E+19 |
| 4 | Base 2 | ELDL | Al(x)Ga(1-x)As | 0.000 | 720 | P | C | 5.0E+19 |
| 3 | Collector | | Al(x)Ga(1-x)As | 0.000 | 2160 | I | UID | 1.0E+16 |
| 2 | Ordered | | In(x)Ga(1-x)P | 0.490 | 120 | N- | Si | 3.0E+17 |
| 1 | Sub-Collector | | GaAs | | 5000 | N | Si | 5.0E+18 |
| 0 | Buffer | | GaAs | | 3000 | UID | UID | UID |
| | Substrate | | 4" GaAs | | | SI (US) | | |

FIG. 2

| Parameter Name | Unit | Mean |
|---|---|---|
| Emitter Sheet Resistance | $\Omega/\text{sq}$ | 38.76 |
| Emitter Spec. Contact Resistivity | $10^{-7}\,\Omega\,\text{cm}^2$ | 13.18 |
| Base Sheet Resistance | $\Omega/\text{sq}$ | 142.43 |
| Base Spec. Contact Resistivity | $10^{-7}\,\Omega\,\text{cm}^2$ | 1.89 |
| Collector Sheet Resistance | $\Omega/\text{sq}$ | 15.89 |
| Collector Sp. Contact Resistivity | $10^{-6}\,\Omega\,\text{cm}^2$ | 0.58 |
| Current Gain @ $1\text{KA}/\text{cm}^2$ 14x14 | | 1.47 |
| Vce Offset Voltage @ $I_B=100\mu A$ | V | 0.16 |
| BVbeo @ $2\text{A}/\text{cm}^2$ | V | 7.69 |
| BVbeo @ $2\text{A}/\text{cm}^2$ | V | 9.78 |
| BVbeo @ $2\text{A}/\text{cm}^2$ | V | 10.70 |

FIG. 3

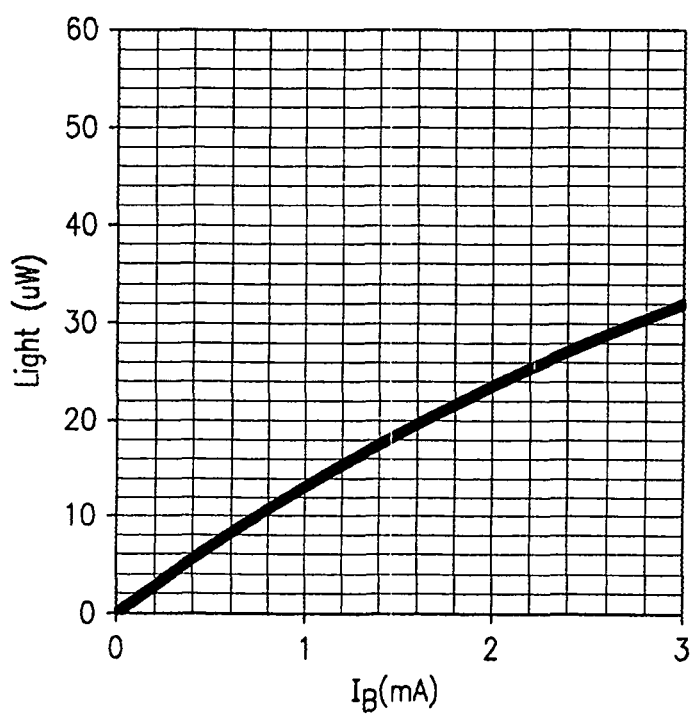

FIG. 4

| Layer | Comment | Character | Material | x | Thickness (Å) | Type | Dopant | Level (/cm³) |
|---|---|---|---|---|---|---|---|---|
| | | | | | | | | |
| 18 | Sub-Emitter | | In(x)Ga(1-x)As | 0.500 | 500 | N | Te | 2.0E+19 |
| 17 | Sub-Emitter | | In(x)Ga(1-x)As | 0.0-0.5 | 500 | N | Te | 2.0E+19 |
| 16 | Sub-Emitter | | Al(x)Ga(1-x)As | 0.000 | 1200 | N | Si | 5.0E+18 |
| 15 | Emitter | | In(x)Ga(1-x)P | 0.490 | 230 | N- | Si | 2.0E+17 |
| 14 | Tunnel Barrier | | In(x)Ga(1-x)P | 0.490 | 300 | N- | Si | 2.0E+17 |
| 13 | Base 1 | | Al(x)Ga(1-x)As | 0.050 | 150 | P | C | 5.0E+19 |
| 12 | Base 1 | ELDL | Al(x)Ga(1-x)As | 0.005 to 0.05 | 200 | P | C | 1.0E+19 |
| 11 | Base 1, Buffer | | GaAs | 0.000 | 30 | i | UID | 1.0E+16 |
| 10 | DQS | 1000 nm | In(x)Ga(1-x)As | | 5 ML | i | UID | 1.0E+16 |
| 9 | | | GaAs | 0.000 | 30 | i | UID | 1.0E+16 |
| 8 | DQS | 1000 nm | In(x)Ga(1-x)As | | 5 ML | i | UID | 1.0E+16 |
| 7 | Base 2, Buffer | | GaAs | 0.000 | 30 | i | UID | 1.0E+16 |
| 6 | Base 2 | ELDL | Al(x)Ga(1-x)As | 0.000 | 150 | P | C | 1.0E+19 |
| 5 | Base 2 | ELDL | Al(x)Ga(1-x)As | 0.000 | 120 | P | C | 5.0E+19 |
| 4 | Base 2 | ELDL | Al(x)Ga(1-x)As | 0.000 | 650 | P | C | 5.0E+19 |
| 3 | Collector | | Al(x)Ga(1-x)As | 0.000 | 2160 | I | UID | 1.0E+16 |
| 2 | Ordered | | In(x)Ga(1-x)P | 0.490 | 120 | N- | Si | 3.0E+17 |
| 1 | Sub-Collector | | GaAs | | 5500 | N | Si | 5.0E+18 |
| 0 | Buffer | | GaAs | | 3000 | UID | UID | UID |
| | Substrate | | 4" GaAs | | | SI (US) | | |

FIG. 7

| Layer | Comment | Character | Material | x | Thickness (Å) | Type | Dopant | Level (/cm³) |
|---|---|---|---|---|---|---|---|---|
| | | | | | | | | |
| 16 | Sub-Emitter | | In(x)Ga(1-x)As | 0.500 | 500 | N | Te | 2.0E+19 |
| 15 | Sub-Emitter | | In(x)Ga(1-x)As | 0.0-0.5 | 500 | N | Te | 2.0E+19 |
| 14 | Sub-Emitter | | Al(x)Ga(1-x)As | 0.000 | 1200 | N | Si | 5.0E+18 |
| 13 | Emitter | | In(x)Ga(1-x)P | 0.490 | 230 | N- | Si | 2.0E+17 |
| 12 | Tunnel Barrier | | In(x)Ga(1-x)P | 0.490 | 300 | N- | Si | 2.0E+17 |
| 11 | Base 1 | | Al(x)Ga(1-x)As | 0.050 | 150 | P | C | 5.0E+19 |
| 10 | Base 1 | ELDL | Al(x)Ga(1-x)As | 0.005 to 0.050 | 200 | P | C | 1.0E+19 |
| 9 | Base 1, Buffer | | GaAs | 0.000 | 30 | i | UID | 1.0E+16 |
| 8 | C-QW | 1010 nm | In(x)Ga(1-x)As | 0.250 | 100 | i | UID | 1.0E+16 |
| 7 | Base 2, Buffer | | GaAs | 0.000 | 30 | i | UID | 1.0E+16 |
| 6 | Base 2 | ELDL | Al(x)Ga(1-x)As | 0.000 | 100 | P | C | 1.0E+19 |
| 5 | Base 2 | ELDL | Al(x)Ga(1-x)As | 0.000 | 180 | P | C | 5.0E+19 |
| 4 | Base 2 | ELDL | Al(x)Ga(1-x)As | 0.000 | 640 | P | C | 5.0E+19 |
| 3 | Collector | | Al(x)Ga(1-x)As | 0.000 | 2160 | I | UID | 1.0E+16 |
| 2 | Ordered | | In(x)Ga(1-x)P | 0.490 | 120 | N- | Si | 3.0E+17 |
| 1 | Sub-Collector | | GaAs | | 5500 | N | Si | 5.0E+18 |
| 0 | Buffer | | GaAs | | 3000 | UID | UID | UID |
| | Substrate | | 4" GaAs | | | SI (US) | | |

FIG. 8

| Layer | Comment | Character | Material | x | Thickness (Å) | Type | Dopant | Level (/cm$^3$) |
|---|---|---|---|---|---|---|---|---|
| 18 | Sub-Emitter | | In(x)Ga(1-x)As | 0.500 | 500 | N | Te | 2.0E+19 |
| 17 | Sub-Emitter | | In(x)Ga(1-x)As | 0.0-0.5 | 500 | N | Te | 2.0E+19 |
| 16 | Sub-Emitter | | Al(x)Ga(1-x)As | 0.000 | 1200 | N | Si | 5.0E+18 |
| 15 | Sub-Emitter | | In(x)Ga(1-x)P | 0.490 | 230 | N− | Si | 2.0E+17 |
| 14 | Tunnel Barrier | | In(x)Ga(1-x)P | 0.490 | 300 | N− | Si | 2.0E+17 |
| 13 | Base 1 | ELDL | Al(x)Ga(1-x)As | 0.000 | 200 | P | C | 5.0E+19 |
| 12 | Base 1 | ELDL | Al(x)Ga(1-x)As | 0.000 | 150 | P | C | 1.0E+19 |
| 11 | Base 1, Buffer | | GaAs | 0.000 | 30 | i | UID | 1.0E+16 |
| 10 | DQS | 1020 nm | In(x)Ga(1-x)As | | 5 ML | i | UID | 1.0E+16 |
| 9 | Base 2, Buffer | | GaAs | 0.000 | 20 | i | UID | 1.0E+16 |
| 8 | QW | 1020 nm | In(x)Ga(1-x)As | | 50 | i | UID | 1.0E+16 |
| 7 | Buffer | | GaAs | 0.000 | 30 | i | UID | 1.0E+16 |
| 6 | Base 2 | ELDL | Al(x)Ga(1-x)As | 0.000 | 150 | P | C | 1.0E+19 |
| 5 | Base 2 | ELDL | Al(x)Ga(1-x)As | 0.000 | 130 | P | C | 5.0E+19 |
| 4 | Base 2 | ELDL | Al(x)Ga(1-x)As | 0.000 | 640 | P | C | 5.0E+19 |
| 3 | Collector | | Al(x)Ga(1-x)As | 0.000 | 2160 | I | UID | 1.0E+16 |
| 2 | Ordered | | In(x)Ga(1-x)P | 0.490 | 120 | N− | Si | 3.0E+17 |
| 1 | Sub-Collector | | GaAs | | 5500 | N | Si | 5.0E+18 |
| 0 | Buffer | | GaAs | | 3000 | UID | UID | UID |
| | Substrate | | 4" GaAs | | | SI (US) | | |

FIG. 9

HIGH SPEED OPTICAL TILTED CHARGE DEVICES AND METHODS

PRIORITY CLAIM

Priority is claimed from U.S. Provisional Patent Application No. 61/629,175, filed Nov. 14, 2011, and said Provisional patent application is incorporated herein by reference.

RELATED APPLICATION

The subject matter of this Application is related to subject matter disclosed in copending U.S. patent application Ser. No. 13/675,245, filed of even date herewith and assigned to the same assignee as the present Application.

FIELD OF THE INVENTION

This invention relates to the field of semiconductor light emitting devices and techniques and, more particularly, to tilted charge light emitting devices and methods.

BACKGROUND OF THE INVENTION

Included in the background of the present invention are technologies relating to heterojunction bipolar transistors (HBTs, which are electrical tilted charge devices) and light-emitting transistors, transistor lasers, and tilted charge light-emitting diodes (respectively, LETs, TLs, and TCLEDs, all of which are optical tilted charge devices). A tilted charge device gets its name from the energy diagram characteristic in the device's base region, which has, approximately, a descending ramp shape from the emitter interface to the collector (or drain, for a two terminal device) interface. This represents a tilted charge population of carriers that are in dynamic flow— "fast" carriers recombine, and "slow" carriers exit via the collector (or drain).

Regarding optical tilted charge devices and techniques, which typically employ one or more quantum size regions in the device's base region, reference can be made, for example, to U.S. Pat. Nos. 7,091,082, 7,286,583, 7,354,780, 7,535,034, 7,693,195, 7,696,536, 7,711,015, 7,813,396, 7,888,199, 7,888,625, 7,953,133, 7,998,807, 8,005,124, 8,179,937, and 8,179,939; U.S. Patent Application Publication Nos. US2005/0040432, US2005/0054172, US2008/0240173, US2009/0134939, US2010/0034228, US2010/0202483, US2010/0202484, US2010/0272140, US2010/0289427, US2011/0150487, and US2012/0068151; and to PCT International Patent Publication Nos. WO/2005/020287 and WO/2006/093883 as well as to the publications referenced in U.S. Patent Application Publication No. US2012/0068151.

An optical tilted charge device includes an active region with built-in free majority carriers of one polarity. At one input to this active region, a single species of minority carriers of opposite polarity are injected and allowed to diffuse across the active region. This active region has features that enable and enhance the conduction of majority carriers and the radiative recombination of minority carriers. On the output side of the region, minority carriers are then collected, drained, depleted or recombined by a separate and faster mechanism. Electrical contacts are coupled to this full-featured region.

In early 2004, a publication described an optical tilted charge device incorporating a quantum well in the base region of the device in order to enhance radiative recombination (see M. Feng, N. Holonyak Jr., and R. Chan, Quantum-Well-Base Heterojunction Bipolar Light-Emitting Transistor, Appl. Phys. Lett. 84, 1952, 2004). In that paper, it was demonstrated that the optical signal followed the sinusoidal electrical input signal at speeds of up to 1 GHz. More than five years later, after further work and fundamental developments (relating, among other developments, to operation methods, active area design, and epilayer structure), it was reported that high speed tilted charge devices as spontaneous emission light emitters, operated at bandwidths of 4.3 GHz (LET) and later at 7 GHz (TCLED). (See G. Walter, C. H. Wu, H. W. Then, M. Feng, and N. Holonyak Jr., Titled-Charge High Speed (7 GHz) Light Emitting Diode, Appl. Phys. Lett. 94, 231125, 2009.) Further improvements have been achieved since that time, but additional advances in efficiency and bandwidth are desirable for achieving commercially practical opto-electronic devices and techniques.

Tilted charge light-emitting devices, for example of the types disclosed in documents listed above (for example, in the form of light-emitting transistors and tilted charge light-emitting transistors and tilted charge light-emitting diodes) can produce spontaneous light emission at relatively high speed and bandwidths. For some applications, however, it would be desired to have tilted charge spontaneous light emitting devices and techniques that can operate at much higher speeds and bandwidths, and the achievement of such devices and techniques are among the objectives hereof.

SUMMARY OF THE INVENTION

The question can be posed: How does one design an efficient, high speed spontaneous emission tilted charge device? For example, how does one progress from 0.1 GHz to a 10 GHz bandwidth? One approach might be to make the device area smaller and narrower to result in smaller resistances (R), smaller capacitances (C) and smaller inductances (L), or to merely utilize the design rules of the fastest InGaP/GaAs heterojunction bipolar transistor (HBT). This would not achieve the objective.

Despite their origin from transistor technology, optical tilted charge devices share few common design traits with the high speed HBT transistor (an electrical tilted charge device). An optical tilted charge device has a quantum size region (typically, one or more quantum wells) in its base region. The addition of a quantum well in the base of a transistor, does not merely introduce another element or defect to assist in recombination, but also a structure which is capable of storing charge, lateral transport, and re-thermalizing of captured carriers. Furthermore, with significantly lower electrical gain (higher base current ratios), problems associated with base sheet resistance (heating, emitter crowding) and base current densities (reliability) is amplified and the importance of base transit time, a big issue in design of HBT's, is dwarfed by concerns of lateral resistance and emitter crowding at low emitter current densities. When designing a high speed optical tilted charge device, optical extraction, beam shape and optical power output can be as important as the electrical gain and electrical bandwidth of the device. Even the design rules which the HBT community has followed with some success, that the speed of an HBT can be increased by continuously shrinking the dimensions of the base-emitter junction and base collector junction, cannot be utilized for a tilted charge light emitter, since the physical dimensional reduction results in increasingly smaller radiative recombination efficiency. Thus, it will be understood that design rules suitable for a purely electrical input/output tilted charge device are not necessarily suitable for devices that require also the optimization of an optical output.

Similarly, the high speed tilted optical charge device shares few common design traits with charge storage light emitters (i.e., diode lasers or light emitting diodes). For example, although both use structures such as a quantum well, the design rules of an optical charge storage device necessitate methods of maximizing confinement or storage of carriers (to improve the probability of stimulated emission process where captured carriers "wait" to be stimulated by a photon field or recombine by spontaneous emission), whereas the design rules of an optical tilted charge device necessitate the minimization of stored carriers. Even design rules for light extraction used in charge storage devices do not simply apply to tilted charge devices due to the physical design restrictions imposed on the tilted charge device (different geometry) and high speed application (e.g. compatibility with a high speed interconnect).

Accordingly, design considerations for an optical tilted charge device are not about finding a balance between the design rules for an HBT and those for a diode light emitter; in other words, not about deciding whether the device should be more like an HBT or like a diode light emitter. Rather, the design paradigm for a tilted charge light emitting device should depend on the particular charge dynamics, geometry, optical characteristics, and applications that are unique to the device. As will be disclosed, an aspect of the invention involves reducing non-radiative recombination associated with base surface recombination. Another aspect of the invention involves reduction of base charge capacitance associated with the lateral transport and unintentional confinement of electrons in the quantum well.

The use of a quantum well (QW) in a heterojunction bipolar transistor (HBT) in conjunction with a thin base layer thickness (the "base 1" region) between the QW and the base surface (e.g. a layer thickness of less than about 300 Angstroms) introduces the problem of carriers tunneling from the quantum well into the surface states where they recombine non-radiatively. Use of an asymmetric base region as a technique for reducing thermalization of captured electrons in QW towards the surface has previously been disclosed (see U.S. Patent Application Publication No. US2010/0202484, assigned to an entity that includes the assignee of the present application). This helps in reducing non-radiative recombination and since electron re-thermalization is preferred toward the collector, it also assists in reducing lateral transport of electrons. The larger bandgap region of the asymmetric base region also acts to reduce surface recombination.

In accordance with the principles hereof, when it is necessary to keep the base 1 region thickness to ~300 Angstroms or less, a tunneling barrier structure comprising, for example, a low doped ($1E-16$ cm$^{-3}$ to $5E-17$ cm$^{-3}$) or unintentionally doped n-type layer structure of thickness preferably between about 15 to 50 nm, can be used to increase the spatial distance from the quantum well to the surface, thereby reducing tunneling of captured carriers in the quantum well to the surface states without having to physically increase the p-type base region between the quantum well and emitter region. The tunnel barrier structure material should preferably have an energy gap greater than the fundamental states of the quantum well, and should be selectively removable by an etching process that will not affect the base 1 region. For a base 1 region comprising GaAs or a low % (<20%) Al, AlGaAs layer, the tunnel barrier can, for example, be made of relatively higher Al % (>35%), AlGaAs or lattice matched or be a strained InAlGaP alloy layer.

An asymmetric base design, with increasingly higher energy barrier, can also be employed in conjunction with the above-described ledge to increase the tunneling barrier height, to generate preferential conditions of carrier re-thermalization towards the collector, and to increase the barrier height, which also reduces tunneling.

In accordance with a form of the invention, a method is set forth for producing optical signals with improved efficiency, including the following steps: providing a layered semiconductor structure that includes a substrate, a semiconductor collector region of a first conductivity type, a semiconductor base region of a second conductivity type disposed on said collector region, and a semiconductor emitter region of said first semiconductor type disposed as a mesa over a portion of a surface of said base region; providing, in said base region, at least one region exhibiting quantum size effects; providing collector, base, and emitter electrodes, respectively coupled with said collector, base and emitter regions; providing a tunnel barrier layer over at least the exposed portion of said surface of said base region; and applying signals with respect to said collector, base, and emitter electrodes to produce optical signals from said base region. In an embodiment of this form of the invention, the step of providing said electrodes includes providing at least a portion of said base electrode as being disposed on said surface of said base region and spaced from said emitter mesa, and said step of providing said tunnel barrier layer comprises providing said tunnel barrier layer on said surface of said base region between said mesa and said base electrode. In this embodiment said step of providing said at least one region exhibiting quantum size effects comprises providing a discontinuous or non-planar quantum size region; that is, quantum dots and/or quantum wires (discontinuous), or a corrugated quantum well (non-planar). Also in this embodiment, said step of providing said base region comprises providing a base region that includes a first base sub-region on the emitter side of said quantum size region, and a second base sub-region on the collector said of said quantum size region, and said first and second base sub-regions are provided with asymmetrical band structures with respect to each other.

In accordance with a further form of the invention, a method is set forth for producing a tilted-charge light-emitting device, including the following steps: forming a layered semiconductor structure that includes a substrate, a semiconductor collector region of a first conductivity type, a semiconductor sub-base region of a second conductivity type, a quantum size region, and a further semiconductor sub-base region of said second conductivity type; depositing a tunnel barrier layer on said further sub-base region; forming a semiconductor emitter mesa of said first conductivity type on a portion of the surface of said barrier layer; and providing collector, base, and emitter electrodes respectively coupled with said collector, base, and emitter regions. In an embodiment of this form of the invention, said barrier layer is deposited over a non-peripheral portion of a surface of said further sub-base region, and said step of forming said base electrode comprises forming said base electrode on a peripheral portion of said further sub-base region, spaced from said emitter mesa. Also in this embodiment, said step of forming said base sub-region and said further base sub-region comprises forming said base sub-region and further base sub-region as having asymmetrical band structures with respect to each other. This can be implemented by forming said further base sub-region with higher bandgap semiconductor material than the semiconductor material of said sub-base region. In an embodiment of this form of the invention, said further base sub-region is formed with a thickness of less than about 30 nm.

In accordance with another form of the invention, there is set forth a tilted-charge light-emitting semiconductor device, comprising: a layered semiconductor structure that includes a substrate, a semiconductor collector region of a first conductivity type, a semiconductor base region of a second conductivity type disposed on said collector region, and a semiconductor emitter region of said first semiconductor type disposed as a mesa over a portion of a surface of said base region; said base region including at least one region exhibiting quantum size effects; collector, base, and emitter electrodes, respectively coupled with said collector, base and emitter regions; and a tunnel barrier layer disposed over at least the exposed portion of said surface of said base region; whereby, signals applied with respect to said collector, base, and emitter electrodes can produce optical signals from said base region. In an embodiment of this form of the invention, at least a portion of said base electrode is disposed on said surface of said base region and spaced from said emitter mesa, and said tunnel barrier layer is disposed on said surface of said base region between said mesa and said base electrode. In an embodiment of this form of the invention, said at least one region exhibiting quantum size effects comprises a discontinuous or non-planar quantum size region.

In accordance with still another form of the invention, a method is set forth for producing optical signals with improved efficiency, including the following steps: providing a layered semiconductor structure that includes a substrate, a semiconductor drain region of a first conductivity type, a semiconductor base region of a second conductivity type disposed on said drain region, and a semiconductor emitter region of said first semiconductor type disposed as a mesa over a portion of a surface of said base region; providing, in said base region, at least one region exhibiting quantum size effects; providing a base/drain electrode coupled with said base and drain regions, and providing an emitter electrode coupled with said emitter region; providing a tunnel barrier layer over at least the exposed portion of said surface of said base region; and applying signals with respect to said base base/drain and emitter electrodes to produce optical signals from said base region. In an embodiment of this form of the invention, said step of providing said electrodes includes providing at least a portion of said base/drain electrode as being disposed on said surface of said base region and spaced from said emitter mesa, and wherein said step of providing said tunnel barrier layer comprises providing said tunnel barrier layer on said surface of said base region between said mesa and said base/drain electrode.

Further features and advantages of the invention will become more readily apparent from the following detailed description when taken in conjunction with the accompanying drawings.

BRIEF DESCRIPTION OF THE DRAWINGS

FIG. 2 is a table showing the epilayer structure of an example of the FIG. 1 device wherein the quantum well is within tunneling distance to the surface of the base. A tunnel barrier of the same material as the emitter is used. An asymmetric base is used to favor re-thermalization towards the collector and increase the barrier height. The tilted charge device epilayers are designed to be compatible with HBT foundry processes.

FIG. 3 is a table showing the processed device DC characteristics for devices fabricated using the structure of FIGS. 1 and 2.

FIG. 4 is a graph of light output as a function of base current for the devices of FIGS. 1 and 2. The distance between emitter mesa edge and base metal edge was varied from 1.5 μm to 7 μm while keeping all other dimensions the same. Increasing the distance d, equivalently increases base resistance (hole resistance) and therefore promotes, comparatively, the lateral transport of electrons in the quantum well towards the base contact. Light was measured using a large area detector via the bottom substrate and plotted vs base current (recombination current). The measured data showed that radiative recombination efficiency did not change as the distance was varied, as can be seen in FIG. 4, in which the four plotted curves, for distances d ranging from 1.5 μm to 7 μm, substantially overlap and appear as a single curve.

FIG. 7 is a table showing the epilayer structure of a device in accordance with another embodiment of the invention. An asymmetric base and discontinuous quantum structure are incorporated into the design. Re-thermalization toward the collector is favored.

FIG. 8 is a table showing epilayer structure of a device in accordance with another embodiment of the invention, wherein a corrugated quantum well is employed.

FIG. 9 is a table showing the epilayer structure of a device in accordance with another embodiment of the invention, wherein a narrow quantum well is used in combination with a discontinuous quantum structure.

DETAILED DESCRIPTION

Figure 1:
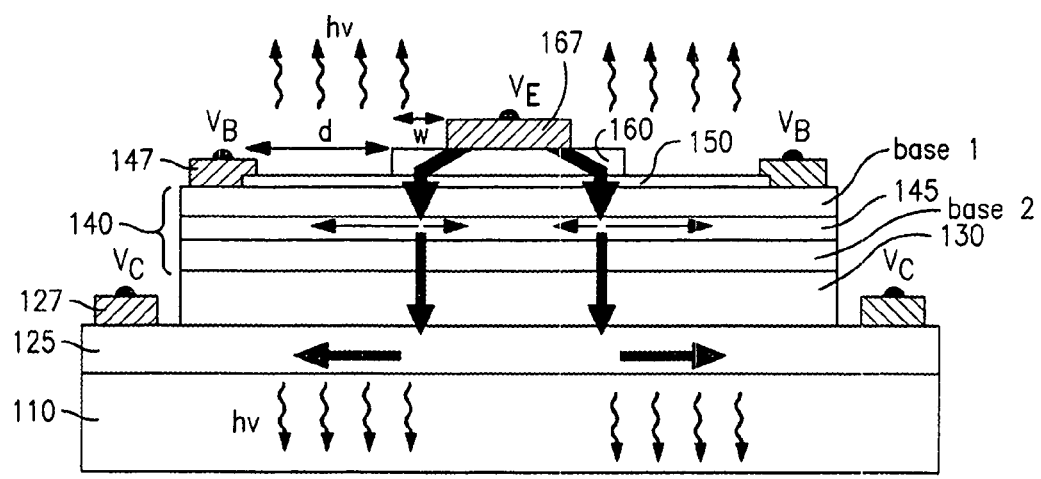
FIG. 1 is a cross-sectional view of an optical tilted charge device, in the form of a light-emitting transistor, in accordance with an embodiment of the invention and which can be used in practicing an embodiment of the method of the invention.

Referring to FIG. 1, there is shown a cross-sectional view of an optical tilted charge device, in the form of a light-emitting transistor, in accordance with an embodiment of the invention and which can be used in practicing an embodiment of the method of the invention. In FIG. 1, a subcollector region 125 is disposed on an undoped substrate 110. A mesa on subcollector 125 includes a base region 140 disposed between a collector region 130 and an emitter region 160 formed on a further mesa. The base region includes one or more quantum wells 145 between an upper base region (base 1) and a lower base region (base 2). In this embodiment, a collector electrode 127 contracts a surface of subcollector region 125, a base electrode 147 contacts a surface of base region 140, and an emitter electrode 167 contacts a surface of emitter region 160. A tunnel barrier layer 150 is disposed over the top surface of the base region 140, between the base region and emitter region 160, covering, inter alia, the exposed portion of the surface of the base region.

The table of FIG. 2 shows an example of a representative epilayer structure for the embodiment of FIG. 1. Except where otherwise indicated, the epilayer structure can be made using existing MOCVD (metalorganic vapor deposition) and/or MBE (molecular beam epitaxy) deposition techniques, and the devices formed using existing photolithography techniques.) In this example there are two $In_{0.2}Ga_{0.8}As$ quantum wells (layers 7 and 9) within GaAs barriers. The upper quantum well (layer 9) is within tunneling distance (24 um) to the surface of base 140 (i.e., the surface of base 1-layer 12). In this example, a tunneling barrier 150 (layer 13) of the same material as the emitter 160 (layer 14) us used; namely $In_{0.49}Ga_{0.51}As$. An asymmetric base is used to favor re-thermalization toward the collector and increase the barrier height. The tunnel barrier structure increases the distance (and reduces tunneling probability) between the carriers in the quantum well to the surface states. Without the tunnel barrier, as indicated, the tunneling distance between the quantum well and the surface state is 24 nm. With the tunnel barrier, this distance is increased to 78 nm (~3 times). Tunneling probability may also be reduced by increasing the thicknesses of layer 11 and 12 (base 1) of the epi-structure. The use of the tunnel barrier allows design that does not require a thick base 1 region (e.g. for base transit time reasons or material reasons). In the table (and other tables hereof), the third column includes, for some layers, the designation "ELDL", which stands for the optional use of engineered long diffusion length material for these layers. In this regard reference can be made to U.S. Patent Application Publication US 2012/006815, which describes the use of such material. It will be understood, however, that the present invention does not require the use of this optional material. The third column of the tables hereof also lists a characteristic emission wavelength associated with the material system and quantum size regions.

In FIG. 1, the photon (wavy) arrows indicate that usable light can be extracted either from the top or from the bottom side. In this embodiment base contact (Ti—Pt—Au) is made to layer 12, emitter contact (Au—Ge) is made to layer 15, and collector contact (Au—Ge) is made to layer 1. The device is operated with the base-emitter junction in forward bias (e.g. $V_{BE}$>1.2 volts) and the base-collector junction in high impedance mode (not necessary reversed bias—e.g. −2.5 volts<$V_{BC}$<0.5 volts). Carrier movement is depicted by solid arrows.

In the present embodiment, because the material of the tunnel barrier is the same as or similar to the emitter, the total effective tunnel barrier thickness, where emitter is present, is accordingly greater. If desired, the use of dissimilar materials for the emitter and tunnel barrier, for example AlGaAs emitter and InAlGaP tunnel barrier, can allow the layers to be separated during processing.

In the present embodiment, a thin 21 nm doped AlGaAs graded layering (layers 11 and 12, with Al content of 0.5% to 5%) are used to increase the barrier height and to favor re-thermalization toward the collector. A 3 nm undoped GaAs buffer layer (layer 10) is added to reduce the contamination of dopants into the quantum well. The tilted charge device epilayers are designed to be compatible with HBT foundry processes. The processed device DC characteristics are shown in the table of FIG. 3. Fabricated devices were lapped to 150 μm, and measured.

A study was performed on the effects of varying the distance between the base contact and emitter mesa (distance d in FIG. 1). The distance between emitter mesa edge and base metal edge was varied from 1.5 μm to 7 μm while keeping all other dimensions the same. Increasing the distance d equivalently increases base resistance (hole resistance) and therefore promotes, comparatively, the lateral transport of electrons in the quantum well towards the base contact. Light was measured using a large area detector via the bottom substrate and plotted vs. base current (recombination current). The measured data showed that radiative recombination efficiency did not change as the distance was varied between from about 1.5 μm to 7 μm. This can be seen in FIG. 4, in which the four plotted curves, for distances d ranging from 1.5 μm to 7 μm, substantially overlap and appear as a single curve. This indicates that the technique hereof, involving use of the described tunnel barrier, was successful in isolating captured electrons in the quantum well from non-radiative surface recombination. The limiting of non-radiative recombination at the surface also assists in reducing the formation of heat spots at the surface (which is an amplified issue in a low current gain transistor such as a light emitting transistor), that could lead to base-emitter leakage and reliability issues.

Figure 5:
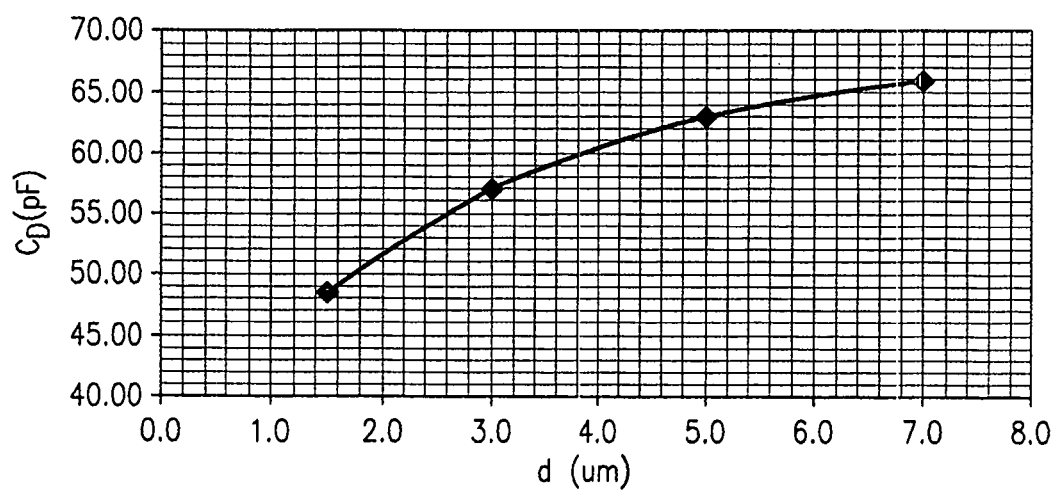
FIG. 5 is a graph which plots the capacitance $C_D$ versus the distance d. AC analysis indicates that as the distance d is varied from 1.5 um to 7 um, the capacitance associated with the electron dynamics (i.e. charge storage capacitance, diffusion capacitance), increases. As only the lateral dimensions (d) were altered, this indicates that the capacitance area has increased due to the lateral travel of electrons via the QW, thus populating a larger area of the quantum well.

Further studies indicated, however, that the preservation of charge in the QW due to the previously described technique resulted in an increase of capacitance, $C_D$, related to the electron dynamics (i.e., base stored capacitance, diffusion capacitance). This can be seen from the graph of FIG. 5, which plots the capacitance $C_D$ versus the distance d. AC analysis indicates that as the distance d is varied from 1.5 um to 7 um, the capacitance associated with the electron dynamics (i.e. charge storage capacitance, diffusion capacitance), increases. As only the lateral dimensions (d) were altered, this indicates that the capacitance area has increased due to the lateral travel of electrons via the quantum well, thus populating a larger area of the quantum well.

Figure 6:
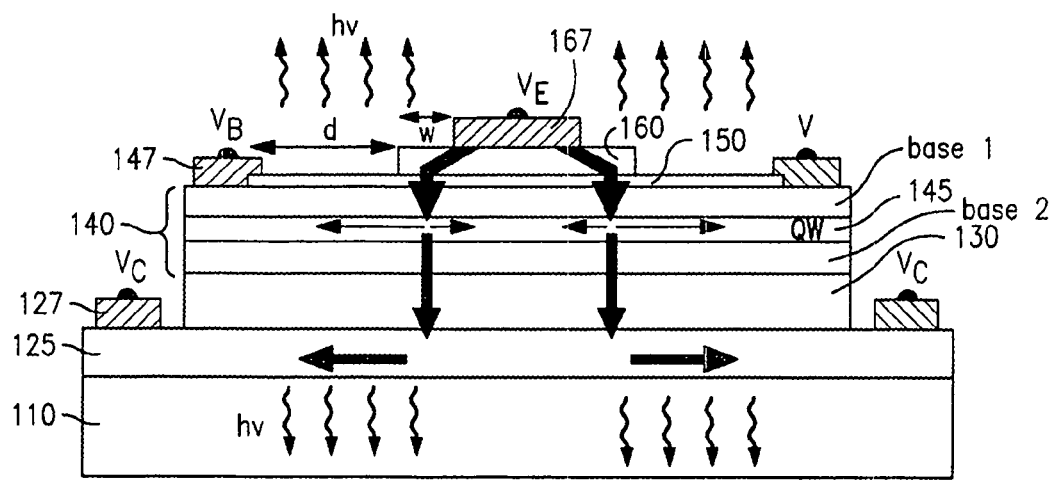
FIG. 6 is a cross-sectional view of another optical tilted charge device similar to the device of FIG. 1 (with like reference numerals representing similar elements), but with the device base region having a discontinuous quantum structure in the form of quantum dots, in the base region.

In applications where it's desirable to reduce $C_D$, an embodiment hereof utilizes a discontinuous quantum structure (DQS) as the quantum size region in the device's base region. The DQS, such as the quantum dots or quantum wires, provides energy gap discontinuities along the lateral axis. The physical discontinuities and the associated energy gap discontinuities (energy barriers) confine or discourage the movement of captured carriers to within the boundaries of the discontinuous quantum structure. This is shown in FIG. 6, which illustrates a device similar to the device of FIG. 1 (with like reference numerals representing similar elements), but with the device base region (designated 140') having a discontinuous quantum structure, in the form of quantum dots 645, in the base region. The DQS structure may be incorporated during growth of epitaxial layers (see the table of FIG. 7), or by patterning of quantum structures followed by a re-growth method.

As represented in the table of FIG. 7, thin n-type InGaAs layers (less than 100 nm) were used in order to enable use of non-alloy contact which is optically smoother compared to alloyed contacts such as AuGe. The resulting smoother contact layer will improve light extraction from the bottom of the substrate by reflecting photons downward. For designs of the FIG. 6 embodiment where only bottom emission is desired, the exposed emitter mesa width (W) may be reduced or eliminated (e.g. by self-aligned methods) so that the entire emitter mesa width is covered by the reflecting non-alloy contact, in order to increase bottom light extraction. The thickness of the InGaAs layers are preferably thin enough to reduce photon self-absorption, but thick enough to enable the use of non-alloy contacts.

As seen in the table of FIG. 7, an asymmetric DQS is incorporated into the design to favor re-thermalization toward the collector. As indicated above, other DQSs, such as quantum wires, may also be used instead of quantum dots. Relatively thin tellerium doped InGaAs sub-emitter layers are used to enable the use of Ti—Pt—Au contacts for the emitter. Ti—Pt—Au provides better reflectivity as compared to Au—Ge alloy contacts, and will offset the photon absorption loss due to the use of low bandgap InGaAs sub-emitter layers.

In the FIG. 6 embodiment, as indicated, the discontinuous quantum structure is used to prevent the lateral transport of electrons towards the base contact. The edge recombination process is this Figure is exaggerated to indicate that the tilted charge device is an edge recombination device. It will be evident that by shrinking the emitter mesa dimensions it is possible to eventually obtain a "uniform" recombination distribution under the emitter mesa. Photon arrows indicate that usable light can be extracted either from the top or from the bottom side. Base contact (Ti—Pt—Au) is made to layer 13, emitter contact (Ti—Pt—Au) is made to layer 18, and collector contact (Au—Ge) is made to layer 1 (referencing the table of FIG. 7). As was noted, relatively thin tellurium doped InGaAs sub-emitter layers (layers 17 and 18) are used to enable the use of Ti—Pt—Au contacts for the emitter. Ti—Pt—Au better reflectivity vs Au—Ge alloy contacts will offset the photon absorption loss due to the use of low bandgap InGaAs sub-emitter layers. As in the FIG. 1 embodiment, the device is operated with the base-emitter junction in forward bias and the base-collector junction in high impedance mode (not necessary reversed bias). A partial DBR or full DBR cavity may also be incorporated into this structure. This embodiment, and others hereof, can also be operated as a laser by providing a suitable resonant optical cavity.

In a further embodiment hereof, lateral conduction of minority carrier is reduced by the use of single or multiple highly strained corrugated (non-planar) quantum wells (C-QW) (for example, InGaAs QW in a InGaP/GaAs LET, with indium composition of more than about 20%), where the quantum well width is defined as the distance between the two barriers confining the fundamental recombination state of the quantum well. Indium composition and corrugation of quantum well can be verified using methods such as SIMS (secondary ion mass spectrometry) analysis, AFM (atomic force microscopy), FIB (focused electron beam), or high resolution TEM (transmission electron microscope). The highly strained surfaces result in growth of non-planar (corrugated) QW surfaces. (Reference can be made for example, to T. Chung, G. Walter, and N. Holonyak, Jr., "Coupled Strained Layer InGaAs Quantum Well Improvement of an InAs Quantum Dot AlGaAs—GaAs—InGaAs—InAs Heterostructure Laser," Appl. Phys. Lett. 79, 4500-4502 (2001); G. Walter, T. Chung, and N. Holonyak, Jr., "High Gain Coupled InGaAs Quantum Well InAs Quantum Dot AlGaAs—GaAs—InGaAs—InAs Heterostructure Diode Laser Operation," Appl. Phys. Lett. 80, 1126-1128 (2002); G. Walter, T. Chung, and N. Holonyak, Jr., "Coupled-Stripe Quantum-Well-Assisted AlGaAs—GaAs—InGaAs—InAs Quantum-Dot Laser," Appl. Phys. Lett., 80, 3045 (2002)). Growth of corrugated QWs can be enhanced with the use of off axis substrates or pre-patterned substrates (for example, selective crystal planes or by photolithography/etching processes). A corrugated or non-planar surface provides optical and electrical wave function perturbations which distorts carrier mobility.

The epilayer structure set forth in the table of FIG. 8 is for an embodiment of a tilted charge device wherein a corrugated quantum well (C-QW) is embedded with a main emission peak designed around 1020 nm. A 1020 nm emission peak light emitter may be used with high-OH (UV/VIS) fibers. (Designs for other emission wavelengths can alternatively be employed.) An asymmetric C-QW is used in this embodiment to favor re-thermalization toward the collector and to increase tunneling distance. If needed, aluminum composition in layer 6, 10 and/or 11 may be increased to reduce the emission wavelength from 1020 nm to, say, 1000 nm without having to reduce indium composition.

In a further embodiment, the epilayer structure of which is shown in the table of FIG. 9, a narrow quantum well (planar QW or C-QW) is used in combination with a DQS to provide improved carrier capture ability and to assist in material growth of the DQS. As set forth in FIG. 9, the tilted charge device includes a thin planar quantum well (QW) coupled via a tunneling barrier to a 5 mono layer (ML) DQS with a main emission peak designed around (but not necessarily) 1020 nm. The quantum well may be designed to have a peak emission wavelength of 1020 nm (same energy) or 980 nm (higher energy). A 1020 nm emission peak light emitter may be used with high-OH fibers. An asymmetric DQS is used in this design to favor re-thermalization toward the collector and to increase tunneling distance.

In a further embodiment, the features of the invention are employed in a two terminal tilted-charge light-emitting diode, of the general type disclosed in U.S. Patent Application Publication No. US2010/0202483 or U.S. Patent Application Publication No. US2012/0068151. In this device, the structure of the FIG. 1 or 6 embodiments is varied, with the region beneath the base region being designated a drain region, and a peripheral base/drain electrode is coupled with the base region and the drain region. The base region, including at least one quantum size region that is preferably discontinuous or corrugated, is provided as in the prior descriptions, and the emitter mesa and emitter contact can also substantially correspond with the prior description. As before, a tunnel barrier layer is advantageously provided over the exposed portion of the base region.

The invention has been described with reference to particular preferred embodiments, but variations within the spirit and scope of the invention will occur to those skilled in the art. For example, while npn light-emitting transistors have been described, it will be understood that certain principles hereof will apply as well to pnp light-emitting transistors.

The invention claimed is:

1. A method for producing, with a semiconductor device, optical signals with improved efficiency, comprising the steps of:
   providing a layered semiconductor structure that includes a substrate, a semiconductor collector region of a first conductivity type, a semiconductor base region of a second conductivity type disposed on said collector region, and a semiconductor emitter region of said first semiconductor type disposed as a mesa over a portion of a surface of said base region;
   providing, in said base region, at least one region exhibiting quantum size effects;
   providing a collector electrode, a base electrode, and an emitter electrode, respectively coupled with said collector region, base region and emitter region, at least a portion of said base electrode being disposed on said surface of said base region and spaced from said mesa;
   providing a tunnel barrier layer over at least the exposed portion of said surface of said base region between said mesa and said base electrode; said base electrode being contiguous to said tunnel barrier layer and
   applying signals with respect to said collector electrode, base electrode, and emitter electrode, to produce optical signals from said base region.

2. The method as defined by claim 1, wherein said step of providing said at least one region exhibiting quantum size effects comprises providing a discontinuous or non-planar quantum size region.

3. The method as defined by claim 1, wherein said step of providing said at least one region exhibiting quantum size effects comprises providing a discontinuous or non-planar quantum size region.

4. The method as defined by claim 2, wherein said step of providing said discontinuous or non-planar quantum size region comprises providing a region of quantum dots and/or quantum wires.

5. The method as defined by claim 1, wherein said step of providing said at least one region exhibiting quantum size effects comprises providing a corrugated quantum well.

6. The method as defined by claim 1, wherein said step of providing said base region comprises providing a base region that comprises substantially GaAs and AlGaAs, and said step of providing said tunnel barrier comprises providing a tunnel barrier comprising InGaP.

7. The method as defined by claim 6, wherein said step of providing said emitter region comprises providing an emitter region comprising InGaP.

8. The method as defined by claim 1, wherein said step of providing said emitter region comprises providing an emitter region comprising AlGaAs, and said step of providing said tunnel barrier comprises providing a tunnel barrier comprising InAlGaP.

9. The method as defined by claim 1, wherein said step of providing said base region comprises providing a base region that includes a first base sub-region on the emitter side of said quantum size region, and a second base sub-region on the collector said of said quantum size region, and providing said first and second base sub-regions with asymmetrical band structures with respect to each other.

10. The method as defined by claim 5, wherein said step of providing said base region comprises providing a base region that includes a first base sub-region on the emitter side of said quantum size region, and a second base sub-region on the collector said of said quantum size region, and providing said first and second base sub-regions with asymmetrical band structures with respect to each other.

11. The method as defined by claim 1, further comprising disposing said base region in an optical resonant cavity, and wherein said optical signals are laser signals.

12. A method for producing a tilted-charge light-emitting device, comprising the steps of:
forming a layered semiconductor structure that includes a substrate, a semiconductor collector region of a first conductivity type, a semiconductor sub-base region of a second conductivity type, a quantum size region, and a further semiconductor sub-base region of said second conductivity type;
depositing a tunnel barrier layer on said further sub-base region over a non-peripheral portion of a surface of said further sub-base region;
forming a semiconductor emitter region of said first conductivity type as a mesa on a portion of the surface of said barrier layer; and
providing a collector electrode, a base electrode, and an emitter electrode respectively coupled with said collector region, base region, and emitter region, said step of providing said base electrode comprising forming said base electrode on a peripheral portion of said further sub-base region, spaced from the mesa and contiguous to the outer edge of said tunnel barrier layer, thereby obtaining said titled-charge light-emitting device.

13. The method as defined by claim 12, wherein said step of forming said base sub-region and said further base sub-region comprises forming said base sub-region and further base sub-region as having asymmetrical band structures with respect to each other.

14. The method as defined by claim 13, wherein said step of forming said base sub-region and said further base sub-region as having asymmetrical band structures with respect to each other comprises forming said further base sub-region with higher bandgap semiconductor material than the semiconductor material of said sub-base region.

15. The method as defined by claim 12, wherein said step of forming said quantum size region comprises forming a discontinuous or non-planar quantum size region.

16. The method as defined by claim 12, wherein said further base sub-region is formed with a thickness of less than about 30 nm.

17. A method for producing, with a semiconductor device, optical signals with improved efficiency, comprising the steps of:
providing a layered semiconductor structure that includes a substrate, a semiconductor drain region of a first conductivity type, a semiconductor base region of a second conductivity type disposed on said drain region, and a semiconductor emitter region of said first semiconductor type disposed as a mesa over a portion of a surface of said base region;
providing, in said base region, at least one region exhibiting quantum size effects;
providing a base/drain electrode coupled with said base region and said drain region, at least a portion of said base/drain electrode being disposed on said surface of said base region and spaced from said mesa, and providing an emitter electrode coupled with said emitter region;
providing a tunnel barrier layer over at least the exposed portion of said surface of said base region between said mesa and said base/drain electrode; said base/drain electrode being contiguous to said tunnel barrier layer and
applying signals with respect to said base base/drain electrode and emitter electrode to produce optical signals from said base region.

18. The method as defined by claim 17, wherein said step of providing said at least one region exhibiting quantum size effects comprises providing a discontinuous or non-planar quantum size region.

19. The method as defined by claim 18, wherein said step of providing said discontinuous or non-planar quantum size region comprises providing a region of quantum dots and/or quantum wires.

20. The method as defined by claim 17, wherein said step of at least one region exhibiting quantum size effects comprises providing a corrugated quantum well.

21. The method as defined by claim 9, wherein said step of providing said at least one region exhibiting quantum size effects comprises providing a corrugated quantum well.

22. The method as defined by claim 11, wherein said step of providing said at least one region exhibiting quantum size effects comprises providing a corrugated quantum well.

* * * * *